(12) United States Patent
Casey

(10) Patent No.: US 7,363,608 B2
(45) Date of Patent: Apr. 22, 2008

(54) ACCELERATING PCB DEVELOPMENT AND DEBUG IN ADVANCE OF PLATFORM ASIC PROTOTYPE SAMPLES

(75) Inventor: Michael Casey, London (GB)

(73) Assignee: LSI Logic Corporation, Milpitas, CA (US)

(*) Notice: Subject to any disclaimer, the term of this patent is extended or adjusted under 35 U.S.C. 154(b) by 191 days.

(21) Appl. No.: 11/008,854

(22) Filed: Dec. 9, 2004

(65) Prior Publication Data
US 2006/0125485 A1 Jun. 15, 2006

(51) Int. Cl.
*G06F 17/50* (2006.01)
(52) U.S. Cl. .................... 716/15; 716/16; 716/17; 703/23; 703/24; 703/25
(58) Field of Classification Search ............ 716/15–17; 703/23–25
See application file for complete search history.

(56) References Cited

U.S. PATENT DOCUMENTS

| 4,901,259 A | * | 2/1990 | Watkins | 703/2 |
| 5,629,876 A | * | 5/1997 | Huang et al. | 703/20 |
| 5,640,337 A | * | 6/1997 | Huang et al. | 703/23 |
| 6,829,727 B1 | * | 12/2004 | Pawloski | 714/28 |
| 7,098,528 B2 | * | 8/2006 | Vasishta et al. | 257/668 |

OTHER PUBLICATIONS

Jacot, Jim, "Introduction to Rapid Silicon Prototyping: Hardware-Software Co-Design for Embedded System-on-a-Chip ICs Class #222," Philips Semiconductors, 10 pgs. Aug. 4, 2004.
"VLSI Velocity™ Rapid Silicon Prototyping," Philips Semiconductors, 21 pgs. Apr. 28, 1999.

* cited by examiner

*Primary Examiner*—Jack Chiang
*Assistant Examiner*—Naum Levin
(74) *Attorney, Agent, or Firm*—Strategic Patent Group P.C.

(57) ABSTRACT

A system and method are provided for accelerating development and debug of a printed circuit board (PCB) designed for use with a platform ASIC in advance of availability of a prototype sample of the platform ASIC. Aspects of the invention include a pin-out adapter card that implements a predefined pin-out of the ASIC and that hosts FPGA logic resources for emulating I/O functionality and some (or all) of the ASIC core logic; a PCB designed for use with the platform ASIC, wherein the PCB includes the predefined ASIC pin-out for eventually mating with the ASIC; and a socket having mating connectors on both sides for mating with the ASIC pin-out on the PCB and to the ASIC pin-out on the adapter card, respectively, for coupling the adapter card to the PCB, thereby enabling development and debug of the PCB prior to availability of ASIC samples.

10 Claims, 3 Drawing Sheets

ACCELERATING PCB DEVELOPMENT AND DEBUG IN ADVANCE OF PLATFORM ASIC PROTOTYPE SAMPLES

FIELD OF THE INVENTION

The present invention relates to integrated circuits, and more particularly to a method and system for accelerating PCB development and debug in advance of platform ASIC prototype samples.

BACKGROUND OF THE INVENTION

The Assignee of the present application has developed a platform ASIC technology called RAPIDCHIP that lets designers quickly and affordably create high-performance, complex, customized ICs. A platform ASIC is a chip building technique where a reference design, referred to as a slice, serves as a starting point for the design of custom chips. Each platform ASIC slice is a pre-manufactured, pre-verified chip with the density and power near that of an ASIC in which all silicon-based layers have been built, leaving the top metal layers to be completed with the customer's unique intellectual property. The customer selects a desired slice that best accommodates their application, and then uses a software tool suite to create a proprietary design, called an instance, using the gates on the final metal layers of the chip to pattern interconnect for gates and memories that embody the customers design. The result is a completed chip with near ASIC performance and density, done in the time it takes to do an FPGA, yet at much lower unit cost.

The platform ASIC procedure includes the following steps. First, an IC manufacturer provides one or more pre-built slices, and then a customer creates a custom design by selecting what components of the slice will be used in the instance. The custom design is then handed-off to the IC manufacturer who completes manufacturing of the slice by adding the customer defined top layers of metal. The customer designs a printed circuit board (PCB) on which the platform ASIC instance will be mounted. Both the platform ASIC and PCB are then manufactured and tested prior to shipment.

One problem with this procedure is that it would be desirable to perform system functional testing, including the PCB, before platform ASIC samples can be prepared. Performing functional tests can be accelerated using Field Programmable Gate Arrays (FPGA) as a prototype for the platform ASIC. However, using FPGAs for prototyping a platform ASIC has disadvantages, which include using a different mixture of resources (e.g., I/O signaling voltages) than the platform ASIC, and having a different pin-out than the platform ASIC. Due to such footprint incompatibility, the traditional use of FPGAs for platform ASIC prototyping does not allow a customer to perform functional testing on the PCB in advance of the availability of platform ASIC prototype samples.

Accordingly, what is needed is a system and method for accelerating PCB development and debug in advance of platform ASIC prototype samples. The present invention addresses such a need.

BRIEF SUMMARY OF THE INVENTION

The present invention provides a system and method for accelerating development and debug of a printed circuit board (PCB) designed for use with a platform ASIC in advance of availability of a prototype sample of the platform ASIC. Aspects of the invention include a pin-out adapter card that implements a predefined pin-out of the platform ASIC and that hosts FPGA logic resources for emulating I/O functionality and some (or all) of the ASIC core logic; a PCB designed for use with the platform ASIC, wherein the PCB includes the predefined ASIC pin-out for eventually mating with the ASIC; and a socket having mating connectors on both sides for mating with the ASIC pin-out on the PCB and to the ASIC pin-out on the adapter card, respectively, for coupling the adapter card to the PCB, thereby enabling development and debug of the PCB prior to availability of ASIC samples.

DETAILED DESCRIPTION OF THE INVENTION

The present invention relates to accelerating PCB development and debug in advance of platform ASIC prototype samples. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for accelerating PCB development and debug in advance of availability of platform ASIC prototype samples. As stated above, PCB debug can be accomplished using an FPGA for prototyping a platform ASIC. But because of footprint incompatibility, either two different PCB's would be required, one to accommodate the FPGA and another to accommodate the platform ASIC, or PCB debug has to be delayed until availability of the platform ASIC prototype samples. The present invention provides a system and method for developing and debugging the PCB designed for the platform ASIC prior to availability of the platform ASIC prototype samples.

Figure 1:
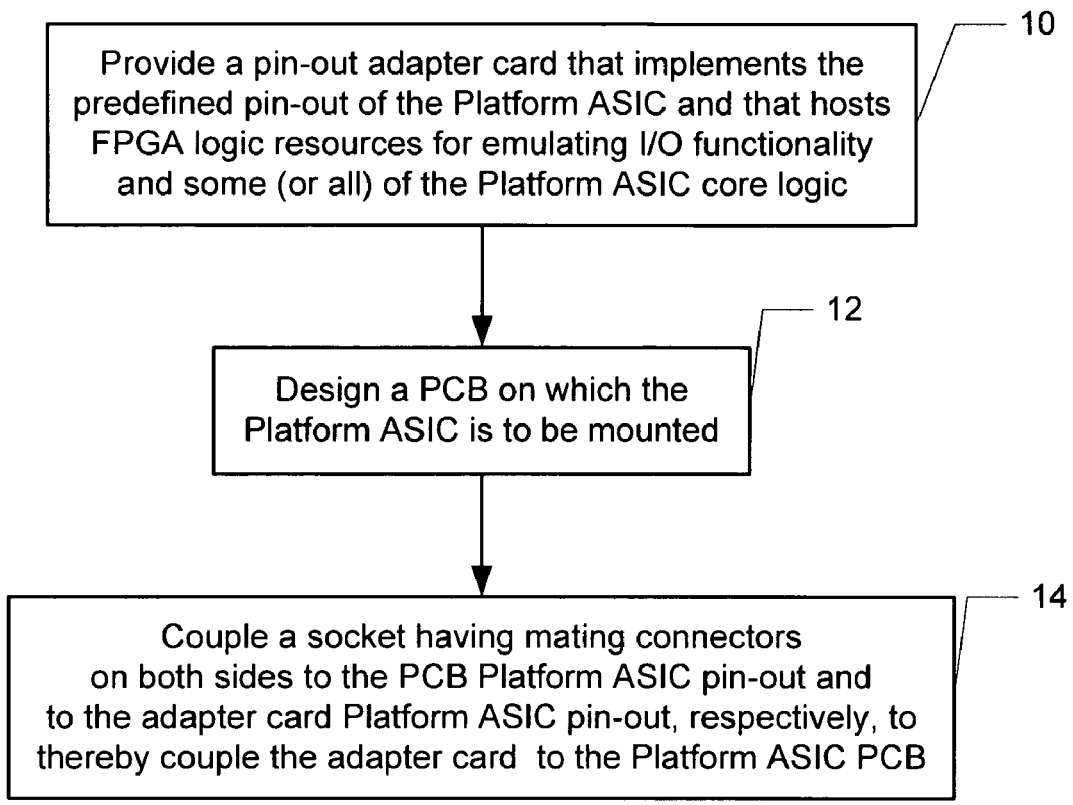
FIG. 1 is a flow diagram illustrating a process for accelerating development and debug of a PCB designed for use with a platform ASIC.

FIG. 1 is a flow diagram illustrating a process for accelerating development and debug of a PCB designed for use with a platform ASIC, such as a platform ASIC in advance of availability of a prototype sample of the platform ASIC in accordance with a preferred embodiment of the present invention. Although the present invention will be described in terms of a preferred embodiment that utilizes a platform ASIC, one with ordinary skill in the art will readily recognize that the process described herein may be used for any type of platform ASIC.

The process begins in step 10 by providing a pin-out adapter card that implements the predefined pin-out of the platform ASIC and that hosts FPGA logic resources for emulating I/O functionality and some (or all) of the platform ASIC core logic.

Figure 2:
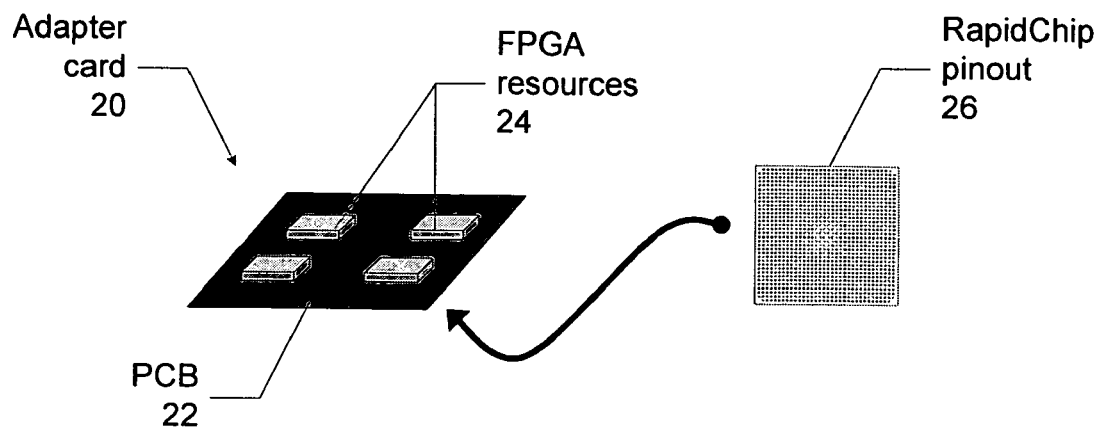
FIG. 2 is a block diagram illustrating a platform ASIC adapter card.

FIG. 2 is a block diagram illustrating a platform ASIC adapter card 20. The adapter card 20 comprises a PCB 22 having multiple routing layers on which one or more FPGAs 24 are mounted on at least one side. One side of the adapter card 20 is provided with the predefined platform ASIC pin-out 26. Using the adapter card 20, the present invention permits emulation of either platform ASIC I/O and partial core logic functionality, or platform ASIC I/O and complete core logic functionality. Wiring patterns implemented in the adapter card 20 ensure that sufficient signals from the FPGA'S 24 on the adapter card 20 are routed to locations on the pin-out connector 26 that are consistent with emulating the pin-out of the platform ASIC.

Figure 3:
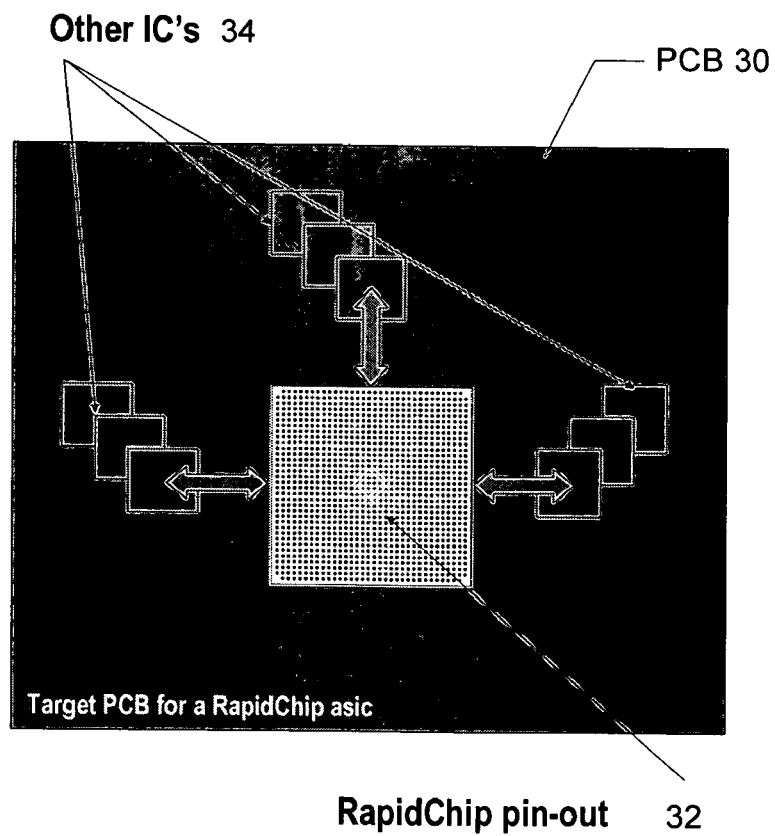
FIG. 3 is a block diagram illustrating a platform ASIC PCB.

Referring again to FIG. 1, in step 12, the PCB on which the platform ASIC is to be mounted may be designed as normal, wherein the PCB includes the predefined platform ASIC pin-out for eventually mating with the platform ASIC. FIG. 3 is a block diagram illustrating a platform ASIC PCB 30. The platform ASIC PCB 30 is shown with the predefined platform ASIC pin-out 33 having a pin pattern for interfacing the platform ASIC (not shown) to any number of ICs 34 having different logic and memory resources. Due to the presence of the adapter card 20, the PCB 30 can be designed normally with the platform ASIC pin-out 32, which has advantages over designing a PCB with pin-outs of competing products, such as FPGA. For example, the PCB 30 may be designed and manufactured with less layers than a PCB designed for an FPGA having a pin-out of the same count.

Referring again to FIG. 1, in step 14, a socket having mating connectors on two sides is coupled to the PCB platform ASIC pin-out 32 and to the adapter card platform ASIC pin-out 26, respectively, to thereby couple the adapter card 20 to the platform ASIC PCB 30 for testing and debugging.

Figure 4:
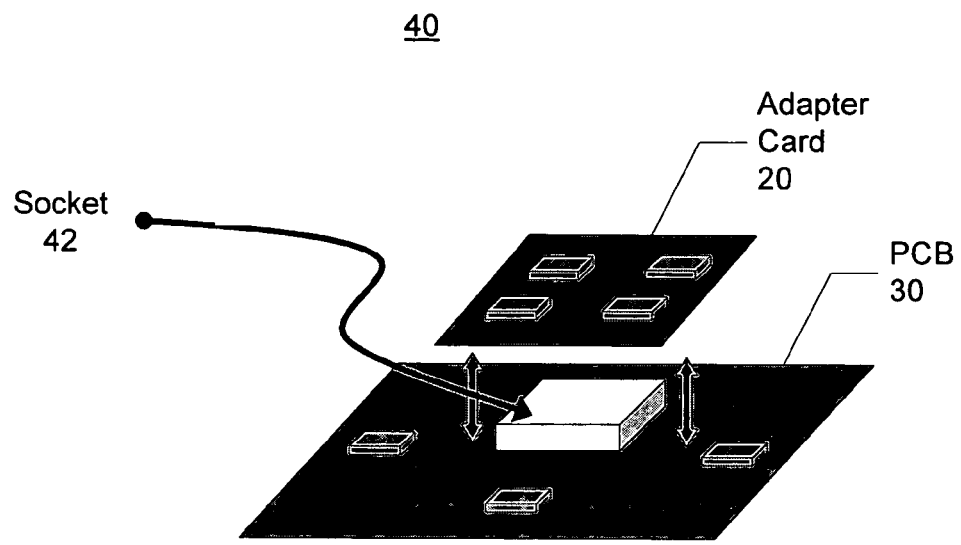
FIG. 4 is a diagram illustrating the socket in use in a PCB development and debug system in accordance with a preferred embodiment.

FIG. 4 is a diagram illustrating the socket 42 in use in a PCB development and debug system 40 in accordance with a preferred embodiment. One side of the socket 42 has mating connectors (not shown) for mating with pins on the platform ASIC pin-out 32 on the PCB 30, while the other side of the socket has mating connectors for mating with the pins on the adapter card platform ASIC pin-out 26 on the adapter card 20. The socket 42 does not modify the locations of signals present on the PCB 30, rather, the socket 42 provides a 1-for-1 pass through for signals. The mating connectors on the socket 42 are not shown as the socket 42 may be mated with the platform ASIC pin-out connector 26 on the adapter card 20 using any one of a number of multiple alternatives such as, pins, spring loaded contacts, and so on.

The adapter card 20 will generally occupy more area than the finished platform ASIC prototype samples, which may mean that the adapter card 20 may not be coupled directly to the PCB 30 because the adapter card 20 may overlap with other ICs 34 on the PCB 30. According to one aspect of the present invention, the socket 42 may be constructed to provide vertical clearance for the adapter card 20, as required by component placement standoff.

In situations where component placement standoff places unreasonable constraints on the use of the socket 42, a second embodiment of the present invention alternatively couples the adapter card 20 to the PCB 30 using high-density cables to overcome the standoff limitations.

Figure 5:
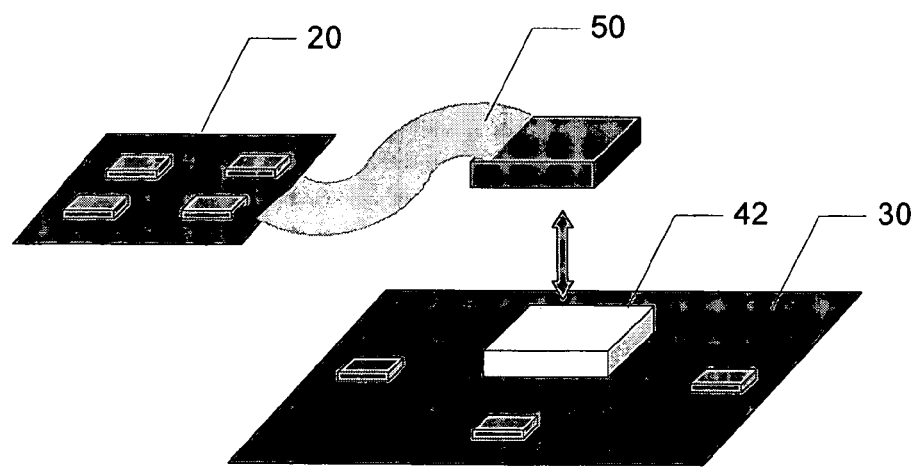
FIG. 5 is a block diagram illustrating the alternative method for coupling the adapter card to the PCB in accordance with the second embodiment of the present invention.

FIG. 5 is a block diagram illustrating the alternative method for coupling the adapter card 20 to the PCB in accordance with the second embodiment of the present invention, where like components from with FIG. 4 have like reference numerals. The adapter card 20 is coupled to the PCB 30 using one or more high-density cables 50 that implement the requisite number of I/O signals. One end of high-density cables 50 terminate on the adapter card 20, which is either the socketed, or soldered directly to the adapter card PCB. The other end of the high-density cables 50 may be either attached directly to the platform ASIC pin-out 32 on PCB 30, or attached through the use of the socket 42.

A method and system for accelerating development and debug of a printed circuit board (PCB) designed for use with a platform ASIC in advance of availability of a prototype sample of the platform ASIC has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

I claim:

1. A method for accelerating development and debug of a printed circuit board (PCB) designed for use with a platform ASIC in advance of availability of a prototype sample of the platform ASIC, the platform ASIC having a predefined pin-out, the method comprising:

providing a pin-out adapter card that implements a predefined adapter card ASIC pin-out of the platform ASIC and that hosts FPGA logic resources for emulating I/O functionality and at least a portion of core logic comprising the platform ASIC;

fabricating the PCB on which the platform ASIC is to be mounted, wherein the PCB includes a predefined PCB ASIC pin-out for eventually mating with the platform ASIC; and coupling a socket having mating connectors on both sides to the PCB ASIC pin-out and to the adapter card ASIC pin-out, respectively, to thereby couple the adapter card to the PCB for testing and debugging.

2. The method of claim 1 further including: implementing the adapter card as a PCB having multiple routing layers on which the one or more FPGAs are mounted at least on one side, and implementing the ASIC pin-out on one of the sides.

3. The method of claim 2 further including: implementing wiring patterns on the adapter card that ensure sufficient signals from the FPGAs on the adapter card are routed to locations on the pin-out connector that are consistent with emulating the pin-out of the ASIC.

4. The method of claim 1 further including: implementing the socket such that the mating connectors on the socket provide a 1-for-1 pass through for signals.

5. The method of claim 1 further including: coupling the adapter card to the PCB using high-density cables to overcome the standoff limitations.

6. A printed circuit board (PCB) development and debug system, comprising:

a pin-out adapter card that implements a predefined adapter card ASIC pin-out of an ASIC and that hosts FPGA logic resources for emulating I/O functionality and some (or all) of the ASIC core logic;

a PCB designed for use with a platform ASIC, wherein the PCB includes a predefined PCB ASIC pin-out for eventually mating with the ASIC; and a socket having mating connectors on both sides for mating with the PCB ASIC pin-out and to the adapter card ASIC pin-out, respectively, for coupling the adapter card to the PCB, thereby enabling development and debug of the PCB prior to availability of ASIC samples.

7. The system of claim 6 wherein the adapter card is implemented as a PCB having multiple routing layers on which the one or more FPGAs are mounted on at least one side, and implementing the ASIC pin-out on one of the sides.

8. The system of claim 7 wherein the adapter card includes wiring patterns that ensures sufficient signals from the FPGAs on the adapter card are routed to locations on the pin-out connector that are consistent with emulating the pin-out of the ASIC.

9. The system of claim 8 further including: implementing the socket such that the mating connectors on the socket providing a 1-for-1 pass through for signals.

10. The system of claim 6 wherein the adapter card is coupled to the PCB using high-density cables to overcome the standoff limitations.

* * * * *